US011335688B1

(12) United States Patent
Liu

(10) Patent No.: US 11,335,688 B1
(45) Date of Patent: May 17, 2022

(54) SEMICONDUCTOR STRUCTURES AND PREPARATION METHODS THEREOF

(71) Applicant: CHANGXIN MEMORY TECHNOLOGIES, INC., Anhui (CN)

(72) Inventor: ChihCheng Liu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 0 days.

(21) Appl. No.: 17/608,748

(22) PCT Filed: May 18, 2021

(86) PCT No.: PCT/CN2021/094243
§ 371 (c)(1),
(2) Date: Nov. 3, 2021

(87) PCT Pub. No.: WO2021/249132
PCT Pub. Date: Dec. 16, 2021

(51) Int. Cl.
*H01L 27/108* (2006.01)
*H01L 23/528* (2006.01)
*H01L 23/522* (2006.01)

(52) U.S. Cl.
CPC .... *H01L 27/10805* (2013.01); *H01L 23/5226* (2013.01); *H01L 23/5283* (2013.01)

(58) Field of Classification Search
CPC ........... H01L 27/10805; H01L 23/5226; H01L 23/5283
See application file for complete search history.

(56) References Cited

U.S. PATENT DOCUMENTS

| 9,691,684 | B2 | 6/2017 | Park et al. |
| 2009/0108314 | A1* | 4/2009 | Cai ........................ H01L 21/84 |
| | | | 257/306 |
| 2010/0044832 | A1* | 2/2010 | Su ..................... H01L 29/66181 |
| | | | 257/532 |
| 2010/0308435 | A1 | 12/2010 | Nowak et al. |

(Continued)

FOREIGN PATENT DOCUMENTS

| CN | 103700644 A | 4/2014 |
| CN | 102257622 A | 9/2017 |
| EP | 2377158 B1 | 9/2017 |

OTHER PUBLICATIONS

International Search Report in Application No. PCT/CN2021/094243, dated Jul. 27, 2021.

(Continued)

*Primary Examiner* — Karen Kusumakar
(74) *Attorney, Agent, or Firm* — Syncoda LLC; Feng Ma

(57) ABSTRACT

In a semiconductor structure preparation method, the trench runs through a well region of a first conductivity type and extends to the substrate below the well region. A heavily doped first electrode layer is formed on the sidewall of the trench. The first electrode layer covers the bottom of the trench and extends into the well region. A capacitor dielectric layer is formed on the surface of the first electrode layer and the sidewall of the trench, and a second electrode layer is formed on the surface of the capacitor dielectric layer to fill the trench. A dielectric layer is formed on the sidewall of the through silicon via, and an interconnect structure is formed on the surface of the dielectric layer to fill the through silicon via.

11 Claims, 13 Drawing Sheets

(56) References Cited

U.S. PATENT DOCUMENTS

| | | | |
|---|---|---|---|
| 2012/0211865 A1* | 8/2012 | Tian | H01L 28/90 |
| | | | 257/532 |
| 2014/0374880 A1* | 12/2014 | Chen | H01L 27/10829 |
| | | | 257/532 |
| 2015/0028450 A1 | 1/2015 | Park et al. | |
| 2016/0043068 A1* | 2/2016 | Ramachandran ... | H01L 27/0255 |
| | | | 257/532 |
| 2017/0287942 A1* | 10/2017 | Wang | H01L 27/10861 |

OTHER PUBLICATIONS

International Search Report and Written Opinion of the International Search Authority (WO/ISA)in Application No. PCT/CN2021/094243, dated Jul. 27, 2021.

* cited by examiner

SEMICONDUCTOR STRUCTURES AND PREPARATION METHODS THEREOF

CROSS-REFERENCE TO RELATED APPLICATIONS

This application is a National Stage of International Application No. PCT/CN2021/094243 filed on May 18, 2021, which claims priority to Chinese Patent Application No. 202010535142.3 filed on Jun. 12, 2020. The disclosures of these applications are hereby incorporated by reference in their entirety.

TECHNICAL FIELD

The present application relates to the technical field of semiconductors, and in particular to a semiconductor structure and a preparation method thereof.

BACKGROUND

Dynamic random access memories (DRAMs) are semiconductor memories. In traditional solutions, cylindrical capacitors are usually used as decouple capacitors in DRAMs to maintain voltage stability.

However, when using the through silicon via (TSV) technology for high-density packaging, the area reserved for the decouple capacitors next to the TSVs is less than the capacitor area in the DRAM array area (cell area). In addition, the process for manufacturing cylindrical capacitors is complicated. Therefore, the use of cylindrical capacitors as decouple capacitors has problems such as small process allowance or high possibility of defects.

SUMMARY

According to various embodiments of the present application, a semiconductor structure and a preparation method thereof are provided.

The present application provides a semiconductor device preparation method, comprising:

providing a substrate, and forming a well region of a first conductivity type in the substrate;

forming at least one trench in the substrate, the trench running through the well region of the first conductivity type and extending into the substrate below the well region of the first conductivity type;

forming a heavily doped first electrode layer on a sidewall of the trench, the first electrode layer covering a bottom of the trench and extending from the bottom of the trench to the well region of the first conductivity type;

forming a through silicon via in the substrate, the through silicon via being located on one side of the well region of the first conductivity type;

forming a capacitor dielectric layer on a surface of the first electrode layer and the sidewall of the trench, and forming a dielectric layer on a sidewall of the through silicon via; and forming a second electrode layer on a surface of the capacitor dielectric layer and forming an interconnect structure on a surface of the dielectric layer, the second electrode layer filling the trench and the interconnect structure filling the through silicon via.

In an embodiment, before forming the at least one trench in the substrate, the method further comprises:

forming a metal interlayer insulating layer on an upper surface of the substrate and forming a conducting structure in the metal interlayer insulating layer, the conducting structure being electrically connected to the well region of the first conductivity type, both at least one trench and the through silicon via running through the metal interlayer insulating layer.

In an embodiment, the second electrode layer is formed on the surface of the capacitor dielectric layer. The second electrode layer may be copper or other metal materials rather than copper. After forming the interconnect structure on the surface of the dielectric layer, the method further comprises:

forming an interconnecting metal layer on an upper surface of the metal interlayer insulating layer, the interconnecting metal layer comprising a plurality of metal interconnect lines.

In an embodiment, forming the first electrode layer on the sidewall of the trench comprises:

forming a heavily doped first electrode material layer in the trench; and subjecting the first electrode material layer to heat treatment to form the first electrode layer on the sidewall of the trench.

In an embodiment, the first electrode layer is located in the substrate and the well region of the first conductivity type, and a plurality of first electrode layers are electrically connected through the well region of the first conductivity type.

In an embodiment, the thickness of the capacitor dielectric layer is about 1000-3000 angstroms.

In an embodiment, a depth of the at least one trench is about 10-20 microns.

In an embodiment, a depth of the through silicon via is about 40-60 microns.

The present application further provides a semiconductor structure, comprising:

a substrate, in which at least one trench is formed;

a well region of a first conductivity type located in the substrate, the at least one trench running through the well region of the first conductivity type and extending into the substrate below the well region of the first conductivity type;

a decouple capacitor located in the trench and the decouple capacitor comprising a heavily doped first electrode layer, a capacitor dielectric layer and a second electrode layer; the capacitor dielectric layer covering a sidewall of the trench, the first electrode layer being located between the capacitor dielectric layer and the substrate and extending from a bottom of the trench to the well region of the first conductivity type, the second electrode layer being located on a surface of the capacitor dielectric layer and filling the trench; and a through silicon via structure, located in the substrate and on one side of the well region of the first conductivity type, and comprising a through silicon via, an interconnect structure and a dielectric layer, the interconnect structure being located in the through silicon via, the dielectric layer being located in the through silicon via and between the interconnect structure and the substrate.

In an embodiment, the semiconductor structure further comprises:

a metal interlayer insulating layer, located on the surface of the substrate;

a conducting structure, located in the metal interlayer insulating layer and electrically connected to the well region of the first conductivity type;

wherein, both the at least one trench and the through silicon via run through the metal interlayer insulating layer.

In an embodiment, a plurality of trenches are comprised in the substrate and the metal interlayer insulating layer to form a plurality of decouple capacitors to maintain a plurality of different voltages stable.

In the semiconductor structure preparation method according to the present application, at least one trench and a through silicon via are formed in the substrate, wherein the at least one trench runs through a well region of a first conductivity type and extends to the substrate below the well region of the first conductivity type. A heavily doped first electrode layer is formed on the sidewall of the trench. The first electrode layer covers the bottom of the trench and extends into the well region of the first conductivity type. A capacitor dielectric layer is formed on the surface of the first electrode layer and the sidewall of the trench, and a second electrode layer is formed on the surface of the capacitor dielectric layer to fill the trench. A dielectric layer is formed on the sidewall of the through silicon via, and an interconnect structure is formed on the surface of the dielectric layer to fill the through silicon via. Because the trench is located in the well region of the first conductivity type and the first electrode layer, the capacitor dielectric layer, and the second electrode layer in the trench constitute a decouple capacitor, the semiconductor structure preparation method has a simple process, and the problems such as small process allowance and high possibility of defects due to the complicated process of the decouple capacitors in DRAMs can be avoided. Furthermore, compared with cylindrical capacitors, the breakdown voltage is high and different voltages can be maintained stable.

BRIEF DESCRIPTION OF THE DRAWINGS

In order to explain technical solutions of embodiments of the present application or in the prior art more clearly, the drawings to be used for describing the embodiments or the prior art will be introduced simply. Apparently, the drawings to be described below are merely some embodiments of the present application, and a person of ordinary skill in the art may further obtain other drawings according to these drawings without paying any creative effort.

REFERENCE NUMERALS

Figure 1:
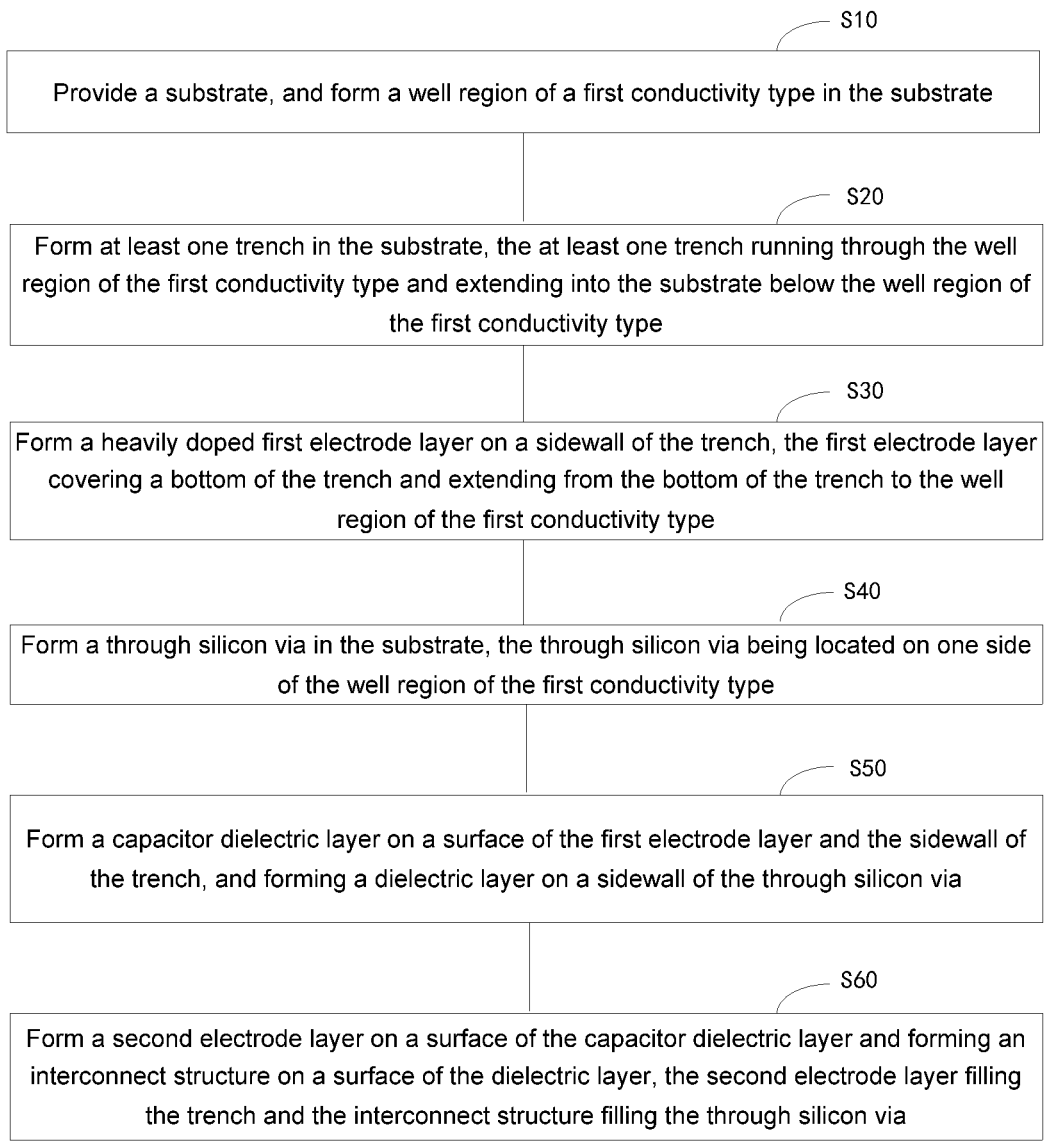
FIG. 1 is a flowchart of a semiconductor memory preparation method according to an embodiment of the present application.

100: semiconductor structure; 10: substrate; 110: trench; 20: well region of the first conductivity type; 30: decouple capacitor; 310: first electrode layer; 311: first electrode material layer; 320: capacitor dielectric layer; 330: second electrode layer; 40: through silicon via structure; 410: through silicon via; 420: interconnect structure; 430: dielectric layer; 50: metal interlayer insulating layer; 510: first metal interlayer insulating layer; 520: second metal interlayer insulating layer; 530: third metal interlayer insulating layer; 60: conducting structure; 610: first conducting structure; 620: second conducting structure; 630: third conducting structure; 70: interconnecting metal layer; 740: interconnecting metal material layer; 80: micro bump.

DETAILED DESCRIPTION

In order to facilitate the understanding of the present application, the present application will be described more fully below with reference to the relevant drawings. Preferred embodiments of the present application are shown in the drawings. However, the present application may be implemented in many different forms and is not limited to the embodiments described herein. On the contrary, these embodiments are provided to make the disclosure of the present application more thorough and comprehensive.

Unless otherwise defined, all technical and scientific terms used herein have the same meaning as commonly understood by a person of ordinary skill in the art to which the present application belongs. Here, terms used in the description of the present application are merely intended to describe specific embodiments, rather than limiting the present application.

It should be understood that, when an element or layer is referred to as being "located on", "adjacent to", "connected to" or "coupled to" other elements or layers, it may be located on, adjacent to, connected to, or coupled to other elements or layers directly or with intervening elements or layers therebetween. In contrast, when an element is referred to as being "directly located on", "directly adjacent to", "directly connected to" or "directly coupled to" other elements or layers, there are no intervening elements or layers therebetween. It should be understood that, although the terms first, second, third, etc., may be used to describe various elements, components, regions, layers, doping types and/or sections, these elements, components, regions, layers, doping types and/or sections should not be limited by these terms. These terms are only used to distinguish one element, component, region, layer, doping type or section from another element, component, region, layer, doping type or section. Therefore, without departing from the teachings of the present application, the first element, component, region, layer, doping type or section discussed below may be expressed as a second element, component, region, layer, doping type or section. For example, the first doping type may be expressed as the second doping type, and similarly, the second doping type may be expressed as the first doping type. The first doping type and the second doping type are different doping types. For example, the first doping type may be P-type and the second doping type may be N-type, or the first doping type may be N-type and the second doping type may be P-type.

Spatial relationship terms, such as "under", "below", "lower", "beneath", "above", "upper", etc., may be used here to describe the relationship between an element or feature shown in the drawings and other elements or features. It should be understood that, in addition to the orientations shown in the drawings, the spatial relationship terms are intended to include different orientations of devices in use and operation. For example, if a device in the drawings is turned over, then elements or features described as being "below" or "beneath" or "under" other elements will be oriented "on" the other elements or features. Therefore, the exemplary terms "below" and "under" may include both upward orientation and downward orientation. In addition, the device may be otherwise oriented (rotated by 90 degrees or in other orientations) and the spatial descriptions used here are interpreted accordingly.

As used here, the singular forms of "a", "an" and "the" are intended to include plural forms, unless otherwise stated. It should be understood that the terms "including" and/or "comprising", when used in this specification, determine the existence of the described features, integers, steps, operations, elements and/or components, but do not exclude the existence or addition of one or more other features, integers, steps, operations, elements, components, and/or groups. Meanwhile, as used here, the term "and/or" includes any and all combinations of related listed items.

The embodiments of the present application will be described here with reference to cross-sectional views that are schematic diagrams of ideal embodiments (and intermediate structures) of the present application, so that changes in the shape due to, for example, the manufacturing technology and/or tolerances may be expected. Therefore, the embodiments of the present application should not be limited to the specific shapes of the regions shown here, but include shape deviations due to, for example, the manufacturing technology. For example, an injection region shown as a rectangle usually has round or curved features and/or injection concentration gradients at its edges, rather than a binary change from an injection region to a non-injection region. Likewise, a buried region formed by the injection may result in some injection in regions between the buried region and a surface through which the injection proceeds. Therefore, regions shown in the drawings are schematic in nature, and their shapes are not intended to show the actual shape of the regions of the device and are not intended to limit the scope of the present application.

Referring to FIG. 1, the present application provides a semiconductor device preparation method. The semiconductor device preparation method comprises:

S10: providing a substrate 10, and forming a well region 20 of a first conductivity type in the substrate 10;

S20: forming at least one trench 110 in the substrate 10, the at least one trench 110 running through the well region 20 of the first conductivity type and extending into the substrate 10 below the well region 20 of the first conductivity type;

S30: forming a heavily doped first electrode layer 310 on the sidewall of the trench 110, the first electrode layer 310 covering the bottom of the trench 110 and extending from the bottom of the trench 110 to the well region 20 of the first conductivity type;

S40: forming a through silicon via 410 in the substrate 10, the through silicon via 410 being located on one side of the well region 20 of the first conductivity type;

S50: forming a capacitor dielectric layer 320 on the surface of the first electrode layer 310 and the sidewall of the trench 110, and forming a dielectric layer 430 on the sidewall of the through silicon via 410; and S60: forming a second electrode layer 330 on the surface of the capacitor dielectric layer 320 and forming an interconnect structure 420 on the surface of the dielectric layer 430, the second electrode layer 330 filling the trench 110 and the interconnect structure 420 filling the through silicon via 410.

In the semiconductor structure preparation method, at least one trench 110 and a through silicon via 410 are formed in the substrate 10, wherein the at least one trench 110 runs through a well region 20 of a first conductivity type and extends to the substrate 10 below the well region 20 of the first conductivity type. A heavily doped first electrode layer 310 is formed on the sidewall of the trench 110. The first electrode layer 310 covers the bottom of the trench 110 and extends into the well region 20 of the first conductivity type. A capacitor dielectric layer 320 is formed on the surface of the first electrode layer 310 and the sidewall of the trench 110, and a second electrode layer 330 is formed on the surface of the capacitor dielectric layer 320 to fill the trench 110. A dielectric layer 430 is formed on the sidewall of the through silicon via 410, and an interconnect structure 420 is formed on the surface of the dielectric layer 430 to fill the through silicon via 410. Because the trench 110 is located in the well region 20 of the first conductivity type and the first electrode layer 310, the capacitor dielectric layer 320, and the second electrode layer 330 in the trench 110 constitute a decouple capacitor/Ni-cap 30, the semiconductor structure preparation method has a simple process, and the problems such as small process allowance and high possibility of defects due to the complicated process of the decouple capacitors in DRAMs can be avoided. Furthermore, compared with cylindrical capacitors, the breakdown voltage is high and different voltages can be maintained stable.

It should be understood that although the steps in the flowchart shown in FIG. 1 are sequentially displayed by following the arrows, these steps are not necessarily performed in the order indicated by the arrows. Unless explicitly stated herein, the execution order of these steps is not strictly limited, and they may be performed in other orders. Moreover, at least some of the steps in FIG. 1 may include multiple sub-steps or multiple stages. These sub-steps or stages are not necessarily performed at the same moment of time, and instead, may be performed at different moments of time. The sub-steps or stages are not necessarily performed sequentially, and instead, may be performed in turn or alternately with other steps or at least some of the sub-steps or stages of other steps.

In an embodiment, the substrate 10 in S10 may comprise any existing semiconductor substrate. In this embodiment, a well region 20 of a first conductivity type is formed in the substrate 10, and the substrate 10 may be, but is not limited to, a substrate of a second conductivity type. In an embodiment, the substrate 10 is a P-type semiconductor substrate (PSUB), and the well region 20 of the first conductivity type is an N-type well region (NWELL).

In an embodiment, before forming the trench 110 in the substrate 10, the method further comprises:

S02: forming a metal interlayer insulating layer 50 on the upper surface of the substrate 10 and forming a conducting structure 60 in the metal interlayer insulating layer 50, the conducting structure 60 being electrically connected to the well region 20 of the first conductivity type, both the at least one trench 110 and the through silicon via 410 running through the metal interlayer insulating layer 50.

In an embodiment, the metal interlayer insulating layer 50 may be formed by a chemical vapor deposition process or the like. In an embodiment, the metal interlayer insulating layer 50 may comprise, but is not limited to, a phosphosilicate glass layer, a borophosphosilicate glass layer, or a low dielectric constant material layer. In an embodiment, when the substrate 10 is a silicon substrate, a borophosphosilicate glass layer may be formed on the surface of the substrate 10 as the metal interlayer insulating layer 50 by the chemical vapor deposition process, wherein the thickness of the borophosphosilicate glass layer may be set according to actual needs.

In an embodiment, forming a metal interlayer insulating layer 50 on the upper surface of the substrate 10 and forming a conducting structure 60 in the metal interlayer insulating layer 50 comprises:

S021: forming a first metal interlayer insulating layer 510 on the upper surface of the substrate 10;

S022: forming a first conducting structure 610 in the first metal interlayer insulating layer 510, the first conducting structure 610 being electrically connected to the well region 20 of the first conductivity type;

S023: forming a second metal interlayer insulating layer 520 on the upper surface of the first metal interlayer insulating layer 510;

S024: forming a second conducting structure 620 in the second metal interlayer insulating layer 520, the second conducting structure 620 being electrically connected to the first conducting structure 610;

S025: forming a third metal interlayer insulating layers 530 on the upper surface of the second metal interlayer insulating layer 520; and S026: forming a third conducting structure 630 in the third metal interlayer insulating layer 530, the third conducting structure 630 being electrically connected to the second conducting structure 620;

wherein, the first metal interlayer insulating layer 510, the second metal interlayer insulating layer 520, and the third metal interlayer insulating layer 530 constitute the metal interlayer insulating layer 50 together, and the first conducting structure 610, the second conducting structure 620, and the third conducting structure 630 constitute the conducting structure 60 together.

Figure 2:
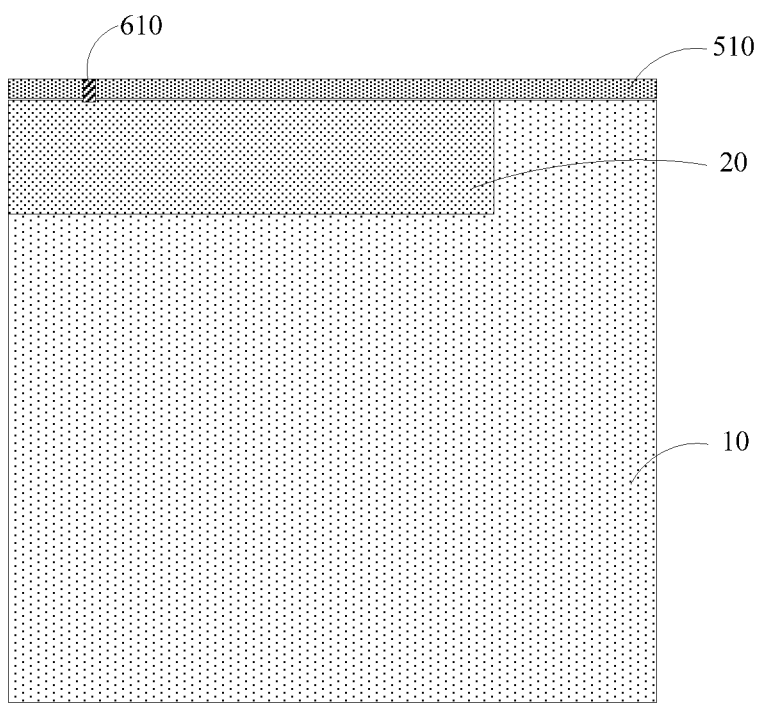
FIG. 2 is a schematic cross-sectional structure diagram after forming a first metal interlayer insulating layer on the upper surface of a substrate and forming a first conducting structure in the first metal interlayer insulating layer, in the semiconductor structure preparation method according to an embodiment of the present application.

Also referring to FIG. 2, in an embodiment, in S021, a first metal interlayer insulating layer 510 is formed on the upper surface of the substrate 10. In this embodiment, the process and material for forming the first metal interlayer insulating layer 510 may be the same as the process and material for any metal interlayer insulating layer 50 in the foregoing embodiments, and will not be repeated here. The thickness of the first metal interlayer insulating layer 510 may be set according to actual needs.

In an embodiment, in S022, forming the first conducting structure 610 in the first metal interlayer insulating layer 510 comprises:

S0221: etching the first metal interlayer insulating layer 510 to form a first connecting hole in the first metal interlayer insulating layer 510, the first connecting hole exposing the well region 20 of the first conductivity type; and S0222: forming a first conducting structure 610 in the first connecting hole. The first conducting structure 610 is electrically connected to the well region 20 of the first conductivity type. In this embodiment, a connecting metal material layer may be formed on the surface of the first metal interlayer insulating layer 510 and in the first connecting hole by, but not limited to, a deposition process. Subsequently, the connecting metal material layer on the surface of the first interlayer dielectric layer 510 may be removed by, but not limited to, a chemical mechanical polishing process or an etching process, and the connecting metal material layer in the first connecting hole may be retained as the first conducting structure 610. In an embodiment, since tungsten has good gap filling capability, the material for the first conducting structure 610 may be, but is not limited to, tungsten.

Figure 3:
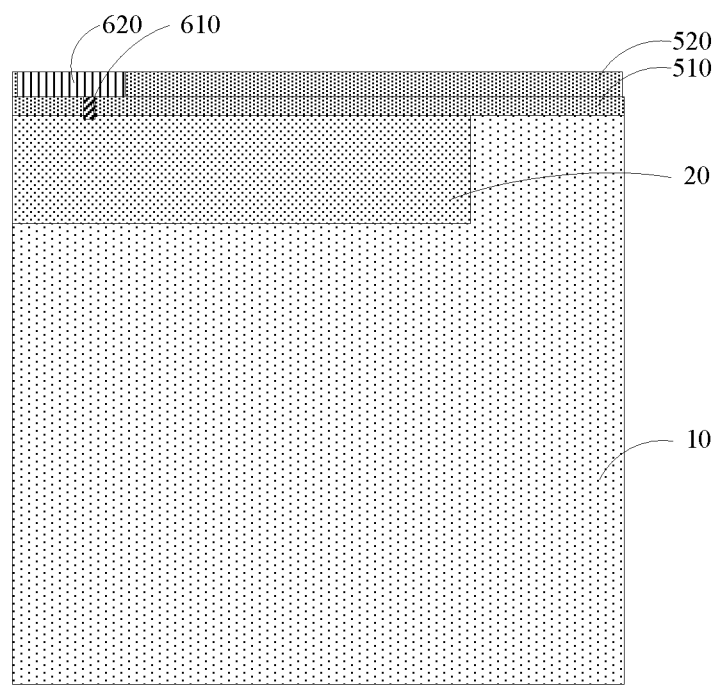
FIG. 3 is a schematic cross-sectional structure diagram after forming a second metal interlayer insulating layer on the upper surface of the first metal interlayer insulating layer and forming a second conducting structure in the second metal interlayer insulating layer, in the semiconductor structure preparation method according to an embodiment of the present application.

Also referring to FIG. 3, in an embodiment, in S023, a second metal interlayer insulating layer 520 is formed on the upper surface of the first metal interlayer insulating layer 510. In this embodiment, the process and material for forming the second metal interlayer insulating layer 520 may be the same as the process and material for any metal interlayer insulating layer 50 in the foregoing embodiments, and will not be repeated here. The thickness of the second metal interlayer insulating layer 520 may be set according to actual needs.

In an embodiment, in S024, forming the second conducting structure 620 in the second metal interlayer insulating layer 520 comprises:

S0241: etching the second metal interlayer insulating layer 520 to form an etching trench in the second metal interlayer insulating layer 520, the etching trench exposes the first connecting hole; and S0242: forming a metal layer in the etched trench as the second conducting structure 620. The second conducting structure 620 is electrically connected to the first conducting structure 610. In this embodiment, a metal material layer may be formed on the surface of the second metal interlayer insulating layer 520 and in the etching trench by, but not limited to, a deposition process. Subsequently, the metal material layer on the surface of the second interlayer dielectric layer 520 may be removed by, but not limited to, a chemical mechanical polishing process or an etching process, and the metal material layer in the etching trench may be retained as the second conducting structure 620. The material for the second conducting structure 620 may be set according to actual needs. In this embodiment, the material for the second conducting structure 620 may comprise, but is not limited to, at least one of tungsten, copper, aluminum, nickel, gold, and silver. In this embodiment, the material for the second conducting structure 620 may be tungsten.

Figure 4:
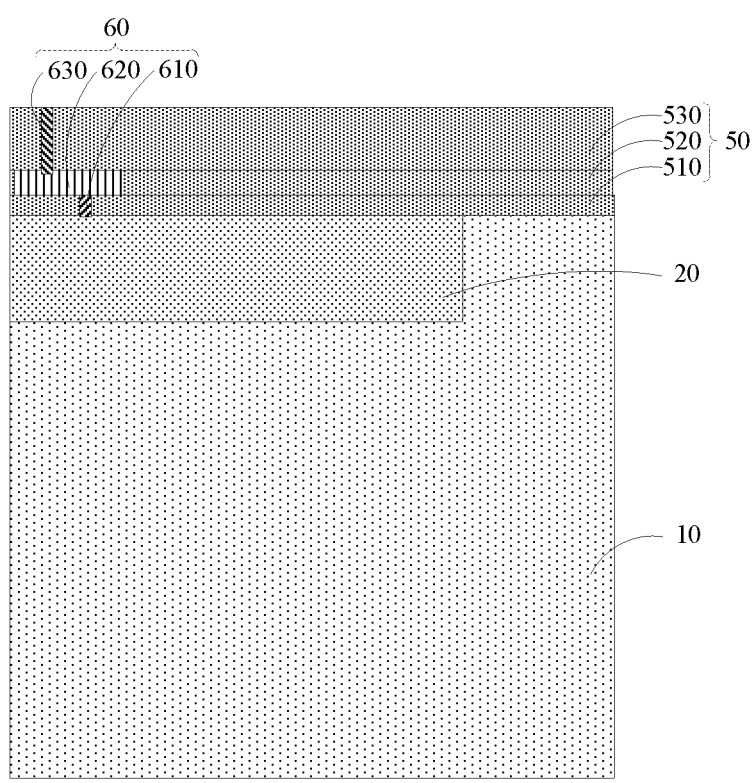
FIG. 4 is a schematic cross-sectional structure diagram after forming a third metal interlayer insulating layer on the upper surface of the second metal interlayer insulating layer and forming a third conducting structure in the third metal interlayer insulating layer, in the semiconductor structure preparation method according to an embodiment of the present application.

Also referring to FIG. 4, in an embodiment, in S025, a third metal interlayer insulating layer 530 is formed on the upper surface of the second metal interlayer insulating layer 520. In this embodiment, the process and material for forming the third metal interlayer insulating layer 530 may be the same as the process and material for any metal interlayer insulating layer 50 in the foregoing embodiments, and will not be repeated here. The thickness of the third metal interlayer insulating layer 530 may be set according to actual needs.

In an embodiment, in S026, forming the third conducting structure 630 in the third metal interlayer insulating layer 530 comprises:

S0261: etching the third metal interlayer insulating layer 530 to form a second connecting hole in the third metal interlayer insulating layer 530, the second connecting hole exposing the second conducting structure 620; and S0262: forming a third conducting structure 630 in the second connecting hole. The third conducting structure 630 is electrically connected to the second conducting structure 620. In this embodiment, a connecting metal material layer may be formed on the surface of the third metal interlayer insulating layer 530 and in the second connecting hole by, but not limited to, a deposition process. Subsequently, the connecting metal material layer on the surface of the third interlayer dielectric layer 530 may be removed by, but not limited to, a chemical mechanical polishing process or an etching process, and the connecting metal material layer in the second connecting hole may be retained as the third conducting structure 630. In an embodiment, the material for the third conducting structure 630 may be, but is not limited to, copper.

Figure 5:
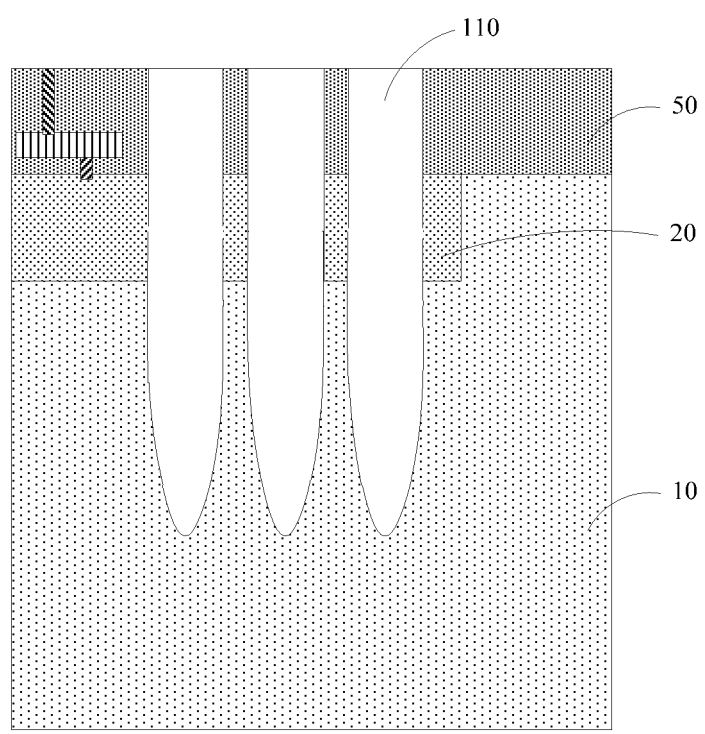
FIG. 5 is a schematic cross-sectional structure diagram after forming a trench in the substrate, in the semiconductor structure preparation method according to an embodiment of the present application.

Also referring to FIG. 5, in an embodiment, in S20, the substrate 10 may be etched by, but not limited to, a dry etching process to form at least one trench 110 in the substrate 10. The depth of the at least one trench 110 may be set according to actual needs, but the at least one trench 110 needs to run through the well region 20 of the first conductivity type and extend into the substrate 10 below the well region 20 of the first conductivity type to form a deep trench cap (DTC). The DTC has a higher breakdown voltage than the cylindrical capacitors in the traditional solutions. In an embodiment, the depths of the at least one trench 110 may be, but is not limited to, about 10-20 microns. Specifically, the depths of the at least one trench 110 may be 10 microns, 15 microns, or 20 microns.

Figure 6:
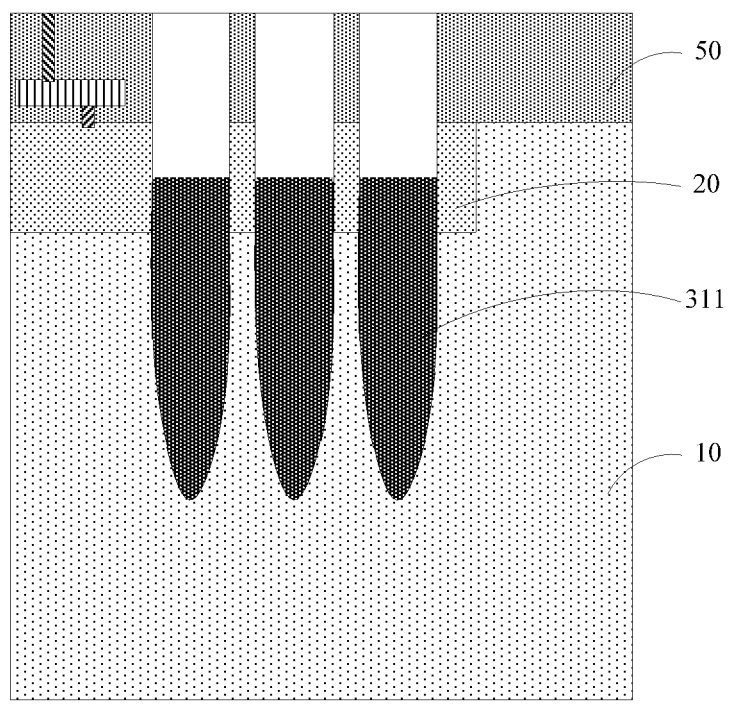
FIG. 6 is a schematic cross-sectional structure diagram after forming a first electrode material layer in the trench, in the semiconductor structure preparation method according to an embodiment of the present application.
Figure 7:
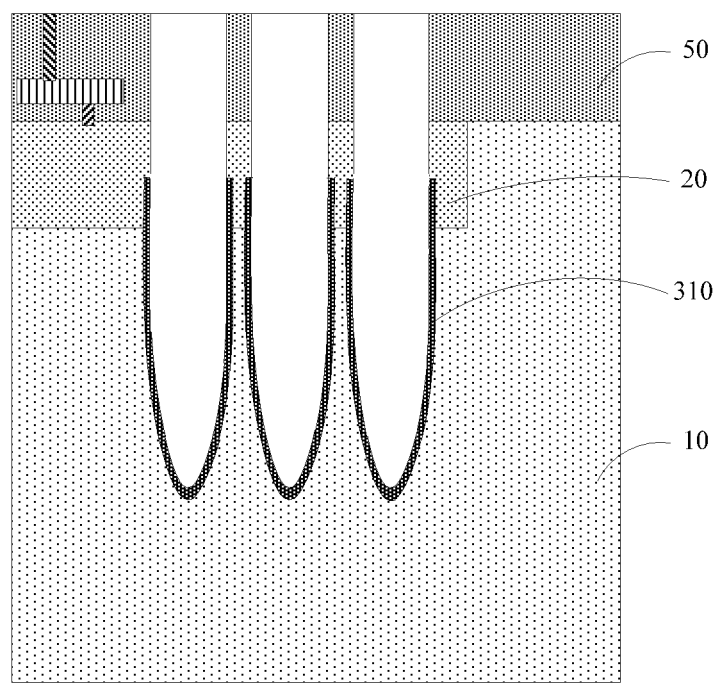
FIG. 7 is a schematic cross-sectional structure diagram after subjecting the first electrode material layer to heat treatment, etching the first electrode material layer subjected to heat treatment in the trench and forming a first electrode layer on the sidewall of the trench, in the semiconductor structure preparation method according to an embodiment of the present application.

Also referring to FIGS. 6-7, in an embodiment, in S30, forming the first electrode layer 310 on the sidewall of the trench 110 comprises:

S310: A heavily doped first electrode material layer 311 is formed in each trench of the at least one trench 110; In this embodiment, a doped material layer is deposited in the trench 110 by, but not limited to, a deposition process to form the first electrode material layer 311. In an embodiment, the first electrode material layer 311 may be, but is not limited to, an N-type heavily doped layer. The use of the N-type heavily doped layer as the first electrode layer 310 of the decouple capacitor 30 can reduce the depletion effect of the capacitor and improve the driving force of the capacitor.

S320: The first electrode layer 310 is subjected to heat treatment to form the first electrode layer 310 on the sidewall of the trench 110. In this embodiment, the first electrode material layer 311 formed after deposition is annealed by an annealing process, and the first electrode material layer 311 subjected to heat treatment in the trench 110 is etched to form the first electrode layer 310. In an embodiment, the first electrode layer 310 is located in the substrate 10 and the well region 20 of the first conductivity type, and a plurality of first electrode layers 310 are electrically connected through the well region 20 of the first conductivity type.

Figure 8:
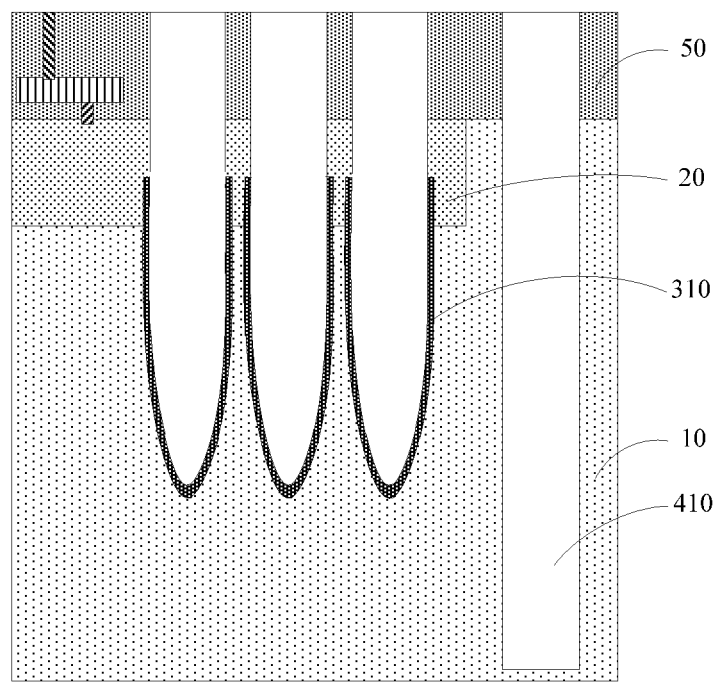
FIG. 8 is a schematic cross-sectional structure diagram after forming a through silicon via in the substrate, in the semiconductor structure preparation method according to an embodiment of the present application.

Also referring to FIG. 8, in an embodiment, in S40, the substrate 10 may be etched by, but not limited to, a dry etching process to form a through silicon via 410 in the substrate 10. The depth of the through silicon via 410 may be set according to actual needs. In an embodiment, the depth of the through silicon via 410 may be, but is not limited to, about 40-60 microns. Specifically, the depth of the through silicon via 410 may be 40 microns, 50 microns, or 60 microns.

In an embodiment, the through silicon via 410 formed in the substrate 10 may run through the substrate 10 at one time. In another embodiment, the through silicon via 410 formed in the substrate 10 may not run through the substrate 10, and then, the back side of the substrate 10 (the side of the substrate 10 away from the interconnecting metal layer 70) may be thinned by a thinning process, until the through silicon via 410 is exposed. That is, the through silicon via 410 runs through the thinned substrate 10.

Figure 9:
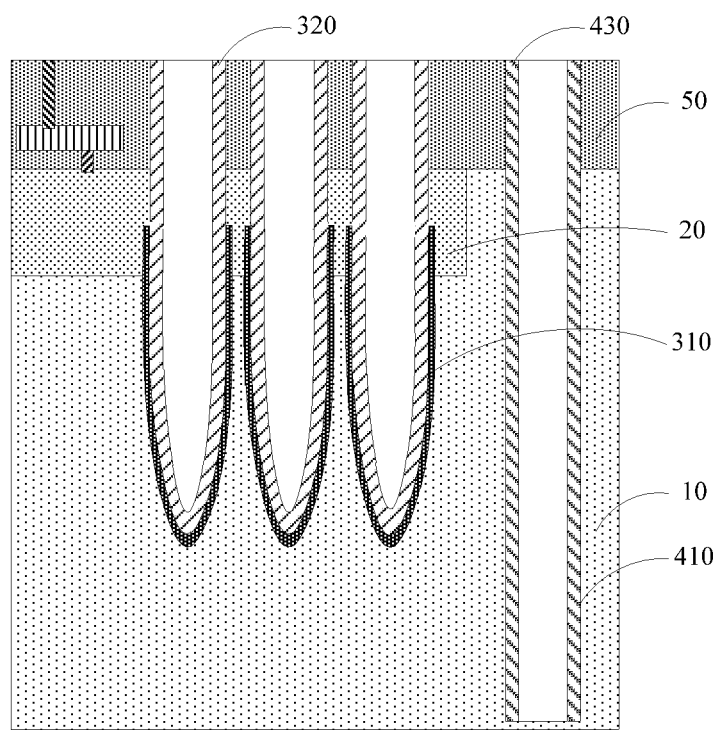
FIG. 9 is a schematic cross-sectional structure diagram after forming a capacitor dielectric layer on the surface of the first electrode layer and the sidewall of the trench, and forming a dielectric layer on the sidewall of the through silicon via, in the semiconductor structure preparation method according to an embodiment of the present application.

Also referring to FIG. 9, in an embodiment, in S50, a capacitor dielectric layer 320 may be formed on the surface of the first electrode layer 310 and the sidewall of the trench 110 by, but not limited to, a deposition process. The capacitor dielectric layer 320 may comprise, but is not limited to, an insulating layer, for example a silicon nitride layer or a silicon oxide layer. The thickness of the capacitor dielectric layer 320 may be set according to actual needs. In an embodiment, the thickness of the capacitor dielectric layer 320 may be, but is not limited to, about 1000-3000 angstroms. Specifically, the thickness of the capacitor dielectric layer 320 may be 1000 angstroms, 1500 angstroms, or 3000 angstroms.

In an embodiment, in S50, a dielectric layer 430 may be formed on the sidewall of the through silicon via 410 by, but not limited to, a deposition process. The dielectric layer 430 may comprise, but is not limited to, an insulating layer, for example a silicon nitride layer or a silicon oxide layer. The thickness of the dielectric layer 430 may be set according to actual needs.

Figure 10:
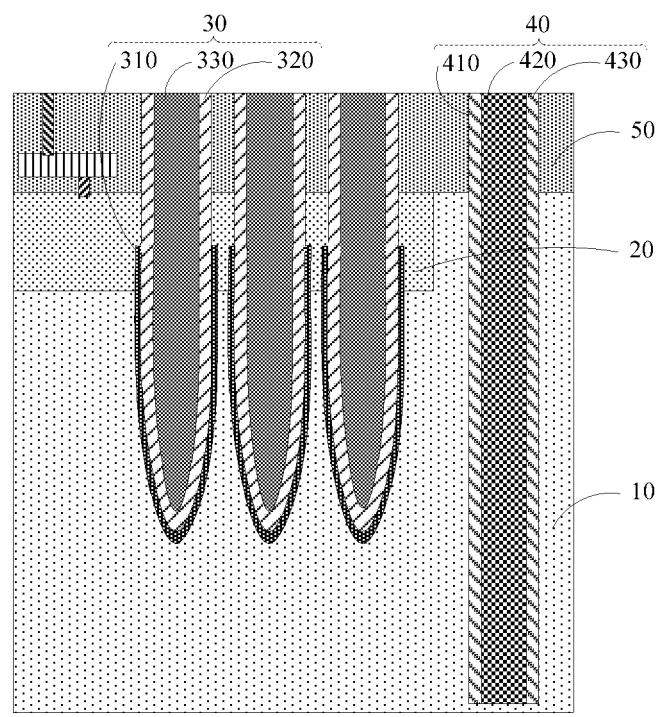
FIG. 10 is a schematic cross-sectional structure diagram after forming a second electrode layer on the surface of the capacitor dielectric layer and forming an interconnect structure on the surface of the dielectric layer, in the semiconductor structure preparation method according to an embodiment of the present application.

Also referring to FIG. 10, in an embodiment, in S60, a second electrode layer 330 may be formed on the surface of the capacitor dielectric layer 320 by, but not limited to, a deposition process, and the second electrode layer 330 fills the trench 110. The material for the second electrode layer 330 may comprise, but is not limited to, at least one of copper, aluminum, nickel, gold, and silver. In this embodiment, the material for the second electrode layer 330 may be copper. In addition, an interconnect structure 420 may be formed on the surface of the dielectric layer 430 by, but not limited to, a deposition process, and the interconnect structure 420 fills the TSV 410. The material for the interconnect structure 420 may comprise, but is not limited to, at least one of copper, aluminum, nickel, gold, and silver. In this embodiment, the material for the interconnect structure 420 may be copper.

In an embodiment, after forming the second electrode layer 330 on the surface of the capacitor dielectric layer 320 and forming the interconnect structure 420 on the surface of the dielectric layer 430, the method further comprises:

S70: forming an interconnecting metal layer 70 on the upper surface of the metal interlayer insulating layer 50, the interconnecting metal layer 70 comprising a plurality of metal interconnect lines.

Figure 11:
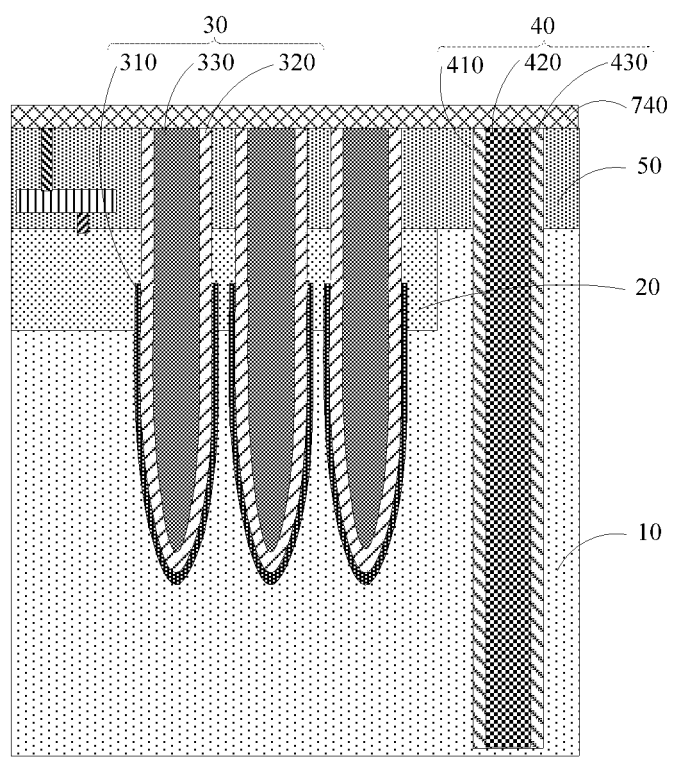
FIG. 11 is a schematic cross-sectional structure diagram after forming an interconnecting metal material layer on the upper surface of the metal interlayer insulating layer, in the semiconductor structure preparation method according to an embodiment of the present application.
Figure 12:
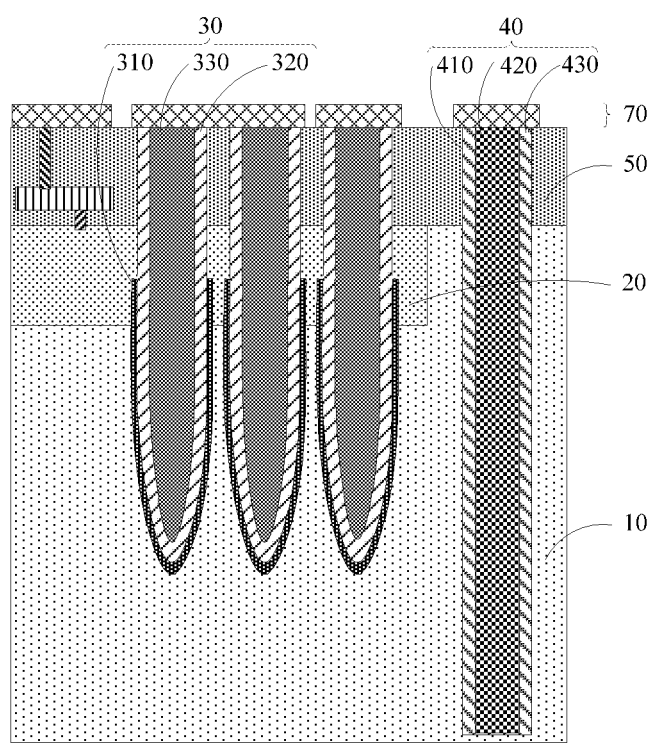
FIG. 12 is a schematic cross-sectional structure diagram after etching the interconnecting metal material layer to form an interconnecting metal layer on the upper surface of the metal interlayer insulating layer, in the semiconductor structure preparation method according to an embodiment of the present application.

Also referring to FIGS. 11-12, in an embodiment, in S70, forming an interconnecting metal layer 70 on the upper surface of the metal interlayer insulating layer 50 comprises: forming an interconnecting metal material layer 740 on the upper surface of the metal interlayer insulating layer 50. The interconnecting metal material layer 740 may be etched by, but not limited to, an etching process to form the interconnecting metal layer 70 on the upper surface of the metal interlayer insulating layer 50. The material for the interconnecting metal layer 70 may be set according to actual needs. In this embodiment, the material for the interconnecting metal layer 70 may comprise, but is not limited to, at least one of tungsten, copper, aluminum, nickel, gold, and silver. In this embodiment, the material for the interconnecting metal layer 70 may be copper.

Figure 13:
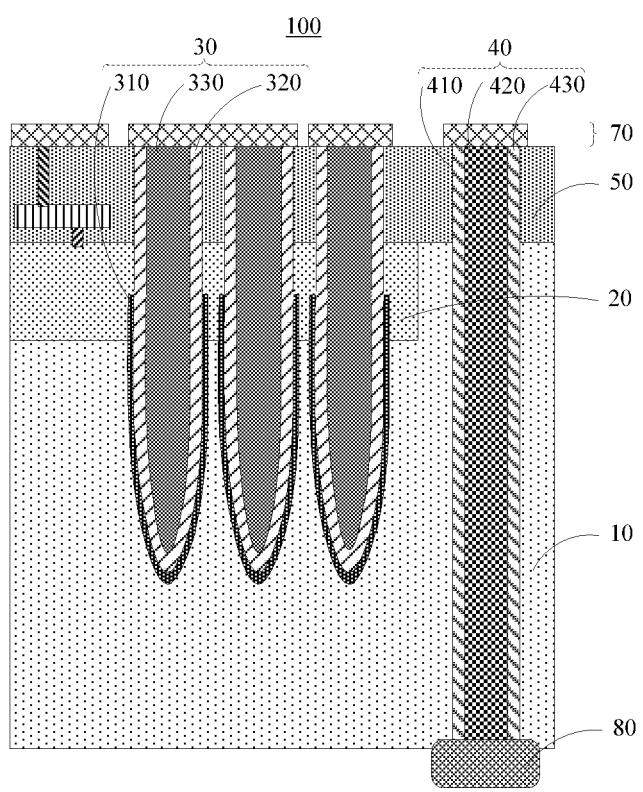
FIG. 13 is a schematic cross-sectional structure diagram after forming micro bumps at an end of the through silicon via structure away from the interconnecting metal layer, in the semiconductor structure preparation method according to an embodiment of the present application.

Also referring to FIG. 13, in an embodiment, the method further comprises: forming micro bumps 80 at an end of the TSV structure 40 away from the interconnecting metal layer 70. The material for the micro bumps 80 may be, but is not limited to, at least one of copper, aluminum, nickel, gold, and silver. In this embodiment, the material for the micro bumps 80 may be copper. An intermetallic compound may be formed between the micro bumps 80 by intermetallic bonding, so as to realize the three-dimensional stacked packaging of a plurality of bare chips.

In an embodiment, in the decouple capacitor 30, the second electrode layer 330 located in the trench 110 is connected to one of the metal wires, that is, the second electrode layer 330 may be used as the anode plate of the decouple capacitor 30. The first electrode layer 310 is connected to the well region 20 of the first conductive type, the first conducting structure 610, the second conducting structure 620, the third conducting structure 630, and one of the metal wires in sequence, that is, the first electrode layer 310 may be used as the cathode plate of the decouple capacitor 30.

The present application further provides a semiconductor structure 100. The semiconductor structure 100 comprises a substrate 10, a well region of a first conductivity type 20, at least one decouple capacitor 30 and a through silicon via structure 40. At least one trench 110 is formed in the substrate 10. The well region 20 of the first conductivity type is located in the substrate 10. The at least one trench 110 runs through the well region 20 of the first conductivity type and extends into the substrate 10 below the well region 20 of the first conductivity type. The decouple capacitor 30 is located in the trench 110. The decouple capacitor 30 comprises a heavily doped first electrode layer 310, a capacitor dielectric layer 320 and a second electrode layer 330. The capacitor dielectric layer 320 covers the sidewall of the trench 110; the first electrode layer 310 is located between the capacitor dielectric layer 320 and the substrate 10, and the first electrode layer 310 extends from the bottom of the trench 110 to the well region 20 of the first conductivity type. The second electrode layer 330 is located on the surface of the capacitor dielectric layer 320 and fills the trench 110. The TSV structure 40 is located in the substrate 10 and on one side of the well region 20 of the first conductivity type. The through silicon via structure 40 comprises a through silicon via 410, an interconnect structure 420 and a dielectric layer 430. The interconnect structure 420 is located in the through silicon via 410, and the dielectric layer 430 is located in the through silicon via 410 and is located between the interconnect structure 420 and the substrate 10.

In the semiconductor structure 100, because the at least one trench 110 is located in the well region 20 of the first conductivity type and the heavily doped first electrode layer 310, the capacitor dielectric layer 320, and the second electrode layer 330 in each trench 110 constitute a decouple capacitor 30, the semiconductor structure preparation method has a simple process, and the problems such as small process allowance and high possibility of defects due to the complicated process of the decouple capacitors in DRAMs can be avoided. Furthermore, compared with cylindrical capacitors, the breakdown voltage is high and different voltages can be maintained stable.

In an embodiment, at least one trench 110 are formed in the substrate 10. The substrate 10 may comprise any existing semiconductor substrate. In this embodiment, a well region 20 of a first conductivity type is formed in the substrate 10, and the substrate 10 may be, but not limited to, a substrate of a second conductivity type. In an embodiment, the substrate 10 may be a P-type semiconductor substrate, and the well region 20 of the first conductivity type may be an N-type well region (NWELL). In addition, the depths of the at least one trench 110 may be set according to actual needs. In this embodiment, the depths of the at least one trench 110 may be, but is not limited to, about 10-20 microns. Specifically, the depths of the at least one trench 110 may be 10 microns, 15 microns, or 20 microns.

In an embodiment, the decouple capacitor 30 comprises a first electrode layer 310, a capacitor dielectric layer 320 and a second electrode layer 330. The material for the first electrode layer 310 may be set according to actual needs. In this embodiment, the first electrode layer 310 may comprise, but is not limited to, an N-type heavily doped layer. The use of the N-type heavily doped layer as the first electrode layer 310 of the decouple capacitor 30 can reduce the depletion effect of the capacitor and improve the driving force of the capacitor. The capacitor dielectric layer 320 may comprise, but is not limited to, an insulating layer, for example a silicon nitride layer or a silicon oxide layer. The thickness of the capacitor dielectric layer 320 may be set according to actual needs. In this embodiment, the thickness of the capacitor dielectric layer 320 may be, but is not limited to, about 1000-3000 angstroms. Specifically, the thickness of the capacitor dielectric layer 320 may be 1000 angstroms, 1500 angstroms, or 3000 angstroms, so that the breakdown voltage of the decouple capacitor 30 is greater than 10V. The material for the second electrode layer 330 may be set according to actual needs. In an embodiment, the material for the second electrode layer 330 may comprise, but is not limited to, at least one of copper, aluminum, nickel, gold, and silver. In this embodiment, the material for the second electrode layer 330 may be copper.

In an embodiment, the substrate 10 and the metal interlayer insulating layer 50 comprise a plurality of trenches 110 to form a plurality of decouple capacitors 30, and the plurality of decouple capacitors 30 can maintain a plurality of different voltages stable. The plurality of first electrode layers 310 in the plurality of decouple capacitors 30 may be electrically connected through the well region 20 of the first conductivity type. In this embodiment, the number of trenches 110 and decouple capacitors 30 may be set according to actual needs. In an embodiment, the trenches 110 and the decouple capacitors 30 may be in one-to-one correspondence.

In an embodiment, the through silicon via structure 40 comprises a through silicon via 410, an interconnect structure 420 and a dielectric layer 430. The depth of the through silicon via 410 may be set according to actual needs. The depth of the through silicon via 410 may be, but is not limited to, about 40-60 microns. Specifically, the depth of the through silicon via 410 may be 40 microns, 50 microns, or 60 microns. The material for the interconnect structure 420 may be set according to actual needs. In an embodiment, the material for the interconnect structure 420 may comprise, but is not limited to, at least one of copper, aluminum, nickel, gold, and silver. In this embodiment, the material for the interconnect structure 420 may be copper. The dielectric layer 430 may comprise, but is not limited to, an insulating layer, for example a silicon nitride layer or a silicon oxide layer. The thickness of the dielectric layer 430 may be set according to actual needs.

In an embodiment, the semiconductor structure 100 further comprises a metal interlayer insulating layer 50 and a conducting structure 60. The metal interlayer insulating layer 50 is located on the surface of the substrate 10. The conducting structure 60 is located in the metal interlayer insulating layer 50 and is electrically connected to the well region 20 of the first conductivity type. Both the at least one trench 110 and the through silicon via 410 run through the metal interlayer insulating layer 50. In an embodiment, the metal interlayer insulating layer 50 comprises a first metal interlayer insulating layer 510, a second metal interlayer insulating layer 520, and a third metal interlayer insulating layer 530 sequentially stacked from the surface of the substrate 10. The conducting structure 60 comprises a first conducting structure 610, a second conducting structure 620 and a third conducting structure 630 sequentially stacked from the surface of the substrate 10. The first conducting structure 610 is located in the first metal interlayer insulating layer 510 and is electrically connected to the well region 20 of the first conductivity type, the second conducting structure 620 is located in the second metal interlayer insulating layer 520 and is electrically connected to the first conducting structure 610, and the third conducting structure 630 is located in the third metal interlayer insulating layer 530 and is electrically connected to the second conducting structure 620.

In an embodiment, the first metal interlayer insulating layer 510, the second metal interlayer insulating layer 520, and the third metal interlayer insulating layer 530 in the metal interlayer insulating layer 510 may comprise, but are not limited to, a phosphosilicate glass layer, a borophosphosilicate glass layer, or a low dielectric constant material layer, and the thickness of the first metal interlayer insulating layer 510, the second metal interlayer insulating layer 520, and the third metal interlayer insulating layer 530 may be set according to actual needs.

In an embodiment, the conducting structure 60 comprises a first conducting structure 610, a second conducting structure 620 and a third conducting structure 630 sequentially stacked from the surface of the substrate 10. The height (thickness) of the first conducting structure 610 along the extension direction of the trench 110 is the same as the thickness of the first metal interlayer insulating layer 510; the height (thickness) of the second conducting structure 620 along the extension direction of the trench 110 is the same as that of the second metal interlayer insulating layer 520; the height (thickness) of the third conducting structure 630 along the extension direction of the trench 110 is the same as the thickness of the third metal interlayer insulating layer 530. In an embodiment, the material for the second conducting structure 620 may comprise, but is not limited to, at least one of tungsten, copper, aluminum, nickel, gold, and silver. In this embodiment, the material for the third conducting structure 630 may be copper. The material for the first conducting structure 610 and the second conducting structure 620 may comprise, but is not limited to, tungsten.

In an embodiment, the semiconductor structure 100 further comprises an interconnecting metal layer 70. The interconnecting metal layer 70 comprises a plurality of metal interconnect lines. In an embodiment, the material for the interconnecting metal layer 70 may be set according to actual needs. The material for the interconnecting metal layer 70 may comprise, but is not limited to, at least one of tungsten, copper, aluminum, nickel, gold, and silver. In this embodiment, the material for the interconnecting metal layer 70 may be copper.

In an embodiment, the semiconductor structure 100 further comprises micro bumps 80. The material for the micro bump 80 may be, but is not limited to, at least one of copper, aluminum, nickel, gold, and silver. In this embodiment, the material for the micro bump 80 may be copper. An intermetallic compound may be formed between the micro bumps 80 by intermetallic bonding by using solder, so as to realize the three-dimensional stacked packaging of a plurality of bare chips.

Various technical features of the above embodiments can be arbitrarily combined. For simplicity, all possible combinations of various technical features of the above embodiments are not described. However, all those technical features shall be included in the protection scope of the present invention if not conflict.

The embodiments described above merely represent certain implementations of the present application. Although those embodiments are described in more specific details, it is not to be construed as any limitation to the scope of the present application. It should be noted that, for a person of ordinary skill in the art, a number of variations and improvements may be made without departing from the concept of the present application, and those variations and improvements should be regarded as falling into the protection scope of the present application. Therefore, the protection scope of the present application should be subject to the appended claims.

What is claimed is:

1. A semiconductor device preparation method, comprising:
   providing a substrate, and forming a well region of a first conductivity type in the substrate;
   forming at least one trench in the substrate, the at least one trench running through the well region of the first conductivity type and extending into the substrate below the well region of the first conductivity type;
   forming a heavily doped first electrode layer on a sidewall of the trench, the first electrode layer covering a bottom of the trench and extending from the bottom of the trench to the well region of the first conductivity type;

forming a through silicon via in the substrate, the through silicon via being located on one side of the well region of the first conductivity type;

forming a capacitor dielectric layer on a surface of the first electrode layer and the sidewall of the trench, and forming a dielectric layer on a sidewall of the through silicon via; and forming a second electrode layer on a surface of the capacitor dielectric layer and forming an interconnect structure on a surface of the dielectric layer, the second electrode layer filling the trench and the interconnect structure filling the through silicon via.

2. The semiconductor device preparation method according to claim 1, before forming the at least one trench in the substrate, the method further comprising:

forming a metal interlayer insulating layer on an upper surface of the substrate and forming a conducting structure in the metal interlayer insulating layer, the conducting structure being electrically connected to the well region of the first conductivity type, both the at least one trench and the through silicon via running through the metal interlayer insulating layer.

3. The semiconductor device preparation method according to claim 2, after forming the second electrode layer on the surface of the capacitor dielectric layer and forming the interconnect structure on the surface of the dielectric layer, the method further comprising:

forming an interconnecting metal layer on an upper surface of the metal interlayer insulating layer, the interconnecting metal layer comprising a plurality of metal interconnect lines.

4. The semiconductor device preparation method according to claim 1, wherein forming the first electrode layer on the sidewall of the trench comprises:

forming a heavily doped first electrode material layer in the trench; and subjecting the first electrode material layer to heat treatment to form the first electrode layer on the sidewall of the trench.

5. The semiconductor device preparation method according to claim 1, wherein the first electrode layer is located in the substrate and the well region of the first conductivity type, and a plurality of first electrode layers are electrically connected by the well region of the first conductivity type.

6. The semiconductor device preparation method according to claim 1, wherein a thickness of the capacitor dielectric layer is 1000-3000 angstroms.

7. The semiconductor device preparation method according to claim 1, wherein a depth of the at least one trench is 10-20 microns.

8. The semiconductor device preparation method according to claim 1, wherein a depth of the through silicon via is 40-60 microns.

9. A semiconductor structure, comprising:

a substrate, in which at least one trench is formed;

a well region of a first conductivity type located in the substrate, the at least one trench running through the well region of the first conductivity type and extending into the substrate below the well region of the first conductivity type;

a decouple capacitor located in the trench and the decouple capacitor comprising a heavily doped first electrode layer, a capacitor dielectric layer and a second electrode layer; the capacitor dielectric layer covering a sidewall of the trench, the first electrode layer being located between the capacitor dielectric layer and the substrate and extending from a bottom of the trench to the well region of the first conductivity type, the second electrode layer being located on a surface of the capacitor dielectric layer and filling the trench; and a through silicon via structure, located in the substrate and on one side of the well region of the first conductivity type, and comprising a through silicon via, an interconnect structure and a dielectric layer, the interconnect structure being located in the through silicon via, the dielectric layer being located in the through silicon via and between the interconnect structure and the substrate.

10. The semiconductor structure according to claim 9, the semiconductor structure further comprising:

a metal interlayer insulating layer, located on a surface of the substrate;

a conducting structure, located in the metal interlayer insulating layer and electrically connected to the well region of the first conductivity type;

wherein, both the at least one trench and the through silicon via run through the metal interlayer insulating layer.

11. The semiconductor structure according to claim 10, wherein a plurality of trenches are comprised in the substrate and the metal interlayer insulating layer to form a plurality of decouple capacitors to maintain a plurality of different voltages stable.

* * * * *